(12) United States Patent
Sone et al.

(10) Patent No.: US 12,058,922 B2
(45) Date of Patent: Aug. 6, 2024

(54) MANUFACTURING METHOD OF DEPOSITION MASK AND MANUFACTURING METHOD OF ORGANIC EL DISPLAY

(71) Applicant: Dai Nippon Printing Co., Ltd., Tokyo (JP)

(72) Inventors: Yasuko Sone, Tokyo (JP); Katsunari Obata, Tokyo (JP)

(73) Assignee: Dai Nippon Printing Co., Ltd., Tokyo (JP)

( * ) Notice: Subject to any disclaimer, the term of this patent is extended or adjusted under 35 U.S.C. 154(b) by 802 days.

(21) Appl. No.: 17/169,863

(22) Filed: Feb. 8, 2021

(65) Prior Publication Data
US 2021/0193928 A1 Jun. 24, 2021

Related U.S. Application Data

(63) Continuation of application No. PCT/JP2019/030786, filed on Aug. 5, 2019.

(30) Foreign Application Priority Data

Aug. 9, 2018 (JP) ................................ 2018-150805

(51) Int. Cl.
*H10K 71/16* (2023.01)
*C23C 14/04* (2006.01)
(Continued)

(52) U.S. Cl.
CPC ......... *H10K 71/166* (2023.02); *C23C 14/042* (2013.01); *C23C 14/24* (2013.01);
(Continued)

(58) Field of Classification Search
None
See application file for complete search history.

(56) References Cited

U.S. PATENT DOCUMENTS

2018/0053894 A1 2/2018 Miyadera et al.
2018/0190906 A1* 7/2018 Takeda ................ H10K 71/166
(Continued)

FOREIGN PATENT DOCUMENTS

JP 2014-135246 A1 7/2014
JP 2014135246 A * 7/2014
(Continued)

OTHER PUBLICATIONS

English translation of the International Preliminary Report on Patentability (Chapter I) (Application No. PCT/JP2019/030786) dated Feb. 18, 2021.
(Continued)

*Primary Examiner* — Michael P. Rodriguez
(74) *Attorney, Agent, or Firm* — BURR PATENT LAW, PLLC

(57) ABSTRACT

A manufacturing method of a deposition mask includes a resin-layer forming step of forming a resin layer on one surface of a substrate by applying a resin solution to the surface of the substrate, a step of forming a non-contact area, which is not in contact with the surface of the substrate in the resin layer, by removing at least a part of the substrate, a step of bringing the resin layer into contact with a liquid or heating the resin layer after the non-contact area has been formed in the resin layer, and a resin-layer processing step of forming an opening in the resin layer by processing the resin layer after the step of bringing the resin layer into contact with the liquid or heating the resin layer.

16 Claims, 15 Drawing Sheets

(51) Int. Cl.
  *C23C 14/24*  (2006.01)
  *C23F 1/02*  (2006.01)
  *H10K 71/00*  (2023.01)
(52) U.S. Cl.
  CPC .............. *C23F 1/02* (2013.01); *H10K 71/00* (2023.02); *H10K 71/164* (2023.02)

(56) References Cited

U.S. PATENT DOCUMENTS

2019/0044070 A1* 2/2019 Nishida .................. B32B 7/025
2020/0165714 A1* 5/2020 Nishida .................. H05B 33/10

FOREIGN PATENT DOCUMENTS

| JP | 2016-130348 A1 | 7/2016 | | |
| JP | 5994952 B2 | 9/2016 | | |
| TW | 201735418 A | * 10/2017 | ............. | C23C 14/04 |
| TW | 201735418 A | 10/2017 | | |
| WO | 2017/110123 A1 | 6/2017 | | |
| WO | 2017/138166 A1 | 8/2017 | | |

OTHER PUBLICATIONS

International Search Report and Written Opinion (Application No. PCT/JP2019/030786) dated Nov. 5, 2019.
Taiwanese Office Action (Application No. 108128208) dated Jan. 12, 2022 (with English translation).

* cited by examiner

|  | Example 1 | | | | Comparative Example 1 | |
|---|---|---|---|---|---|---|
|  | Before and after first washing | | Before and after second washing | | Before and after first washing | |
|  | Amount of change in X direction | Amount of change in Y direction | Amount of change in X direction | Amount of change in Y direction | Amount of change in X direction | Amount of change in Y direction |
| Average value | 0.36 μm | 0.60 μm | 0.38 μm | 0.29 μm | 2.51 μm | 1.04 μm |
| Maximum value | 1.07 μm | 1.11 μm | 1.46 μm | 1.15 μm | 4.18 μm | 1.59 μm |
| Minimum value | 0.01 μm | 0.06 μm | 0.01 μm | 0.01 μm | 2.00 μm | 0.04 μm |

FIG. 19

|  | Example 2 | | Comparative Example 2 | |
|---|---|---|---|---|
|  | Before and after first washing | | Before and after second washing | |
|  | Amount of change in X direction | Amount of change in Y direction | Amount of change in X direction | Amount of change in Y direction |
| Average value | 0.26 μm | 0.80 μm | 2.78 μm | 1.31 μm |
| Maximum value | 0.87 μm | 1.49 μm | 3.28 μm | 1.79 μm |
| Minimum value | 0.00 μm | 0.07 μm | 1.74 μm | 0.40 μm |

FIG. 20

MANUFACTURING METHOD OF DEPOSITION MASK AND MANUFACTURING METHOD OF ORGANIC EL DISPLAY

CROSS-REFERENCE TO RELATED APPLICATIONS

This application is a continuation application of International Application No. PCT/JP2019/30786, filed on Aug. 5, 2019, which claims the benefit of priority from Japanese Patent Application No. 2018-150805, filed on Aug. 9, 2018. The entire contents of these applications are incorporated herein by reference.

BACKGROUND

Field

Embodiments of the present disclosure relate to a manufacturing method of a deposition mask and a manufacturing method of an organic EL display.

Background Art

As a product using organic EL device becomes larger, or as a substrate size becomes larger, the demand for a larger deposition mask has been increasing. Since metal plate is used for manufacturing a deposition mask made of metal, a metal plate also becomes larger. Unfortunately, the current metal processing technology does not readily enable forming an accurate slit in a large metal plate, and cannot produce a high-definition slit. In addition, when a deposition mask is made only of metal, its mass increases as it becomes larger. Thus, the total mass including a frame also increases. As a result, such a deposition mask is difficult to be handled.

Under these circumstances, Patent Document 1 proposes a deposition mask including a metal layer provided with slits and a resin mask laminated on a surface of the metal layer. The resin mask has openings arranged in rows and columns corresponding to a pattern to be made by deposition.

Patent Document 1: JP5994952B

SUMMARY

The manufacturing method of the deposition mask described above includes a step of forming the resin layer on a surface of the substrate, and a step of forming the opening in the resin layer. The resin layer is formed by applying a resin solution to the surface of the substrate. The opening is formed by processing the resin layer by, for example, laser processing. When the resin layer is formed by application of a resin solution, strain may occur and remain inside the resin layer. When the opening is formed in the resin layer with residual strain, a position of the opening may change as the strain subsequently relieves.

The object of the present disclosure is to provide a manufacturing method of a deposition mask capable of effectively solving such a problem.

An embodiment of the present disclosure is:
a manufacturing method of a deposition mask comprising:
 a resin-layer forming step of forming a resin layer on a surface of a substrate by applying a resin solution to the surface of the substrate;
 a step of forming a non-contact area that is not in contact with the surface of the substrate in the resin layer by removing at least a part of the substrate;
 a step of bringing the resin layer into contact with a liquid or heating the resin layer after the non-contact area has been formed in the resin layer; and
 a resin-layer processing step of forming a second opening in the resin layer by processing the resin layer after the step of bringing the resin layer into contact with a liquid or heating the resin layer.

In the manufacturing method of a deposition mask according to the embodiment of the present disclosure, the step of bringing the resin layer into contact with a liquid or heating the resin layer may include a liquid contacting step of bringing the resin layer into contact with a liquid.

In the manufacturing method of a deposition mask according to the embodiment of the present disclosure, the liquid contacting step may include an ultrasonically processing step of ultrasonically processing the resin layer.

In the manufacturing method of a deposition mask according to the embodiment of the present disclosure, the step of bringing the resin layer into contact with a liquid or heating the resin layer may further include a drying step of removing the liquid adhering to the resin layer after the liquid contacting step.

In the manufacturing method of a deposition mask according to the embodiment of the present disclosure, the step of bringing the resin layer into contact with a liquid or heating the resin layer may include a heating step of heating the resin layer.

In the manufacturing method of a deposition mask according to the embodiment of the present disclosure, a thickness of the resin layer may be 3 μm or more and 10 μm or less.

In the manufacturing method of a deposition mask according to the embodiment of the present disclosure,
 the resin-layer forming step may include a step of preparing a metal plate as the substrate and a step of forming a resin layer on the surface of the metal plate;
 the step of forming a non-contact area may include a step of forming a first opening in the metal plate by etching the metal plate; and
 the step of bringing the resin layer into contact with a liquid or heating the resin layer may include a step of bringing the resin layer of a laminate including the metal plate the first opening formed therein and the resin layer laminated to the metal plate into contact with a liquid or heating the resin layer of the laminate.

The manufacturing method of a deposition mask according to the embodiment of the present disclosure may further comprise a support fixing step of fixing the laminate to a support in a state where tension is applied to the laminate, and
 the step of bringing the resin layer into contact with a liquid or heating the resin layer may include a step of bringing the resin layer of the laminate fixed to the support into contact with a liquid or heating the resin layer of the laminate fixed to the support.

In the manufacturing method of a deposition mask according to the embodiment of the present disclosure, a thickness of the metal plate may be 5 μm or more and 100 μm or less.

In the manufacturing method of a deposition mask according to the embodiment of the present disclosure,
 the step of forming a non-contact area may include a step of peeling the resin layer from the substrate; and
 the step of bringing the resin layer into contact with a liquid or heating the resin layer may include a step of bringing the resin layer peeled from the substrate into contact with a liquid or heating the resin layer peeled from the substrate.

The manufacturing method of a deposition mask according to the embodiment of the present disclosure may further comprise a support fixing step of fixing the resin layer to a support, and the step of bringing the resin layer into contact with a liquid or heating the resin layer may include a step of bringing the resin layer fixed to the support into contact with a liquid or heating the resin layer fixed to the support.

The manufacturing method of a deposition mask according to the embodiment of the present disclosure may comprise a step of forming a laminate by partially forming a metal layer on the resin layer by a plating process after the resin-layer forming step; and the step of forming a non-contact area may include a step of bringing the resin layer of the laminate into contact with a liquid or heating the resin layer of the laminate.

The manufacturing method of a deposition mask according to the embodiment of the present disclosure may further comprise a support fixing step of fixing the laminate to a support, and the step of bringing the resin layer into contact with a liquid or heating the resin layer may include a step of bringing the resin layer of the laminate fixed to the support into contact with a liquid or heating the resin layer of the laminate fixed to the support.

In the manufacturing method of a deposition mask according to the embodiment of the present disclosure, a thickness of the metal layer may be 1 μm or more and 50 μm or less.

Another embodiment of the present disclosure is a manufacturing method of an organic EL display comprising:

a step of preparing a deposition mask manufactured by the manufacturing method of a deposition mask above described;

a step of assembling the deposition mask and a substrate to be deposited such that the resin layer of the deposition mask faces the substrate to be deposited; and a deposition step of depositing a deposition material to the substrate to be deposited through the second opening of the resin layer of the deposition mask.

The manufacturing method of an organic EL display according to the embodiment of the present disclosure may comprise a step of washing the deposition mask after the deposition step.

In the manufacturing method of an organic EL display according to the embodiment of the present disclosure, the step of washing the deposition mask may include a step of immersing the deposition mask in a washing liquid.

In the manufacturing method of an organic EL display according to the embodiment of the present disclosure, the step of washing the deposition mask may include a step of generating ultrasonic waves in the washing liquid.

The embodiments of this disclosure can suppress the change in positions of the openings in the resin layer.

BRIEF DESCRIPTION OF THE DRAWINGS

FIG. 19 is a view showing measuring results of amounts of change in the positions of the second openings before and after washing, in an Example 1 and a Comparative Example 1.

FIG. 20 is a view showing measuring results of amounts of change in the positions of the second opening before and after washing, in an Example 2 and a Comparative Example 2.

DETAILED DESCRIPTION

Figure 1:
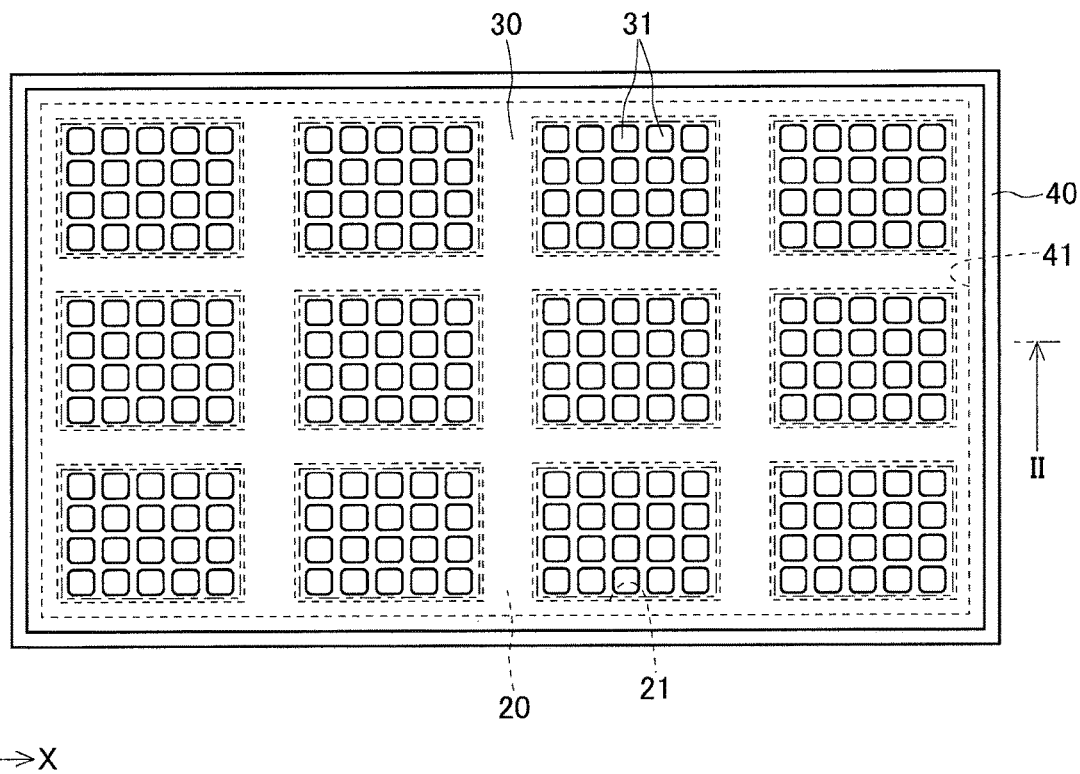
FIG. 1 is a plan view showing a deposition mask according to a first embodiment.

A structure of a mask according to one embodiment and its manufacturing method are described in detail hereafter with reference to the drawings. Embodiments shown hereafter are examples of embodiments of the present disclosure and the present disclosure should not be limited to these embodiments. In this specification, terms such as "plate", "substrate", "sheet" and "film" are not differentiated from one another based only on the difference of designations. For example, the "plate" is a concept including a member that can be referred to as sheet or film. The term "surface (sheet surface, film surface)" means a surface corresponding to a planar direction of a plate (sheet, film) member when the plate (sheet, film) member is seen as a whole and in perspective. A normal direction with regard to the plate (sheet, film) member means a normal direction with respect to a surface (sheet plane, film plane) of the member. Further, terms specifying shapes, geometric conditions and their degrees, e.g., "parallel", "orthogonal", etc., and values of a length and an angle are not limited to their strict definitions, but construed to include a range capable of exerting a similar function.

In the drawings referenced in the embodiments, the same or similar numeral is given to the same part or a part having a similar function, and the repeated description thereof may be omitted. A dimensional ratio of the drawings may differ from an actual one for convenience of explanation. A part of a structure may be omitted from the drawings.

First Embodiment

A first embodiment is described with reference to FIGS. 1 to 9. FIGS. 1 to 9 are views showing the first embodiment.

(Structure of Deposition Mask)

A structure of a deposition mask according to this embodiment is described with reference to FIGS. 1 and 2. The deposition mask described herein is not limited to the embodiments described hereafter, and may be any embodiments which satisfy the following conditions: "a metal layer having a first opening formed therein and a resin mask having a second opening formed therein are laminated; the second opening is formed in an area overlapping the first opening; and the second opening correspond to a pattern to be made by deposition". For example, the first opening formed in the metal layer may be stripe-shaped (not shown in figure). Further, the first opening of the metal layer may be formed at an area not overlapping an entire screen. The deposition mask may be manufactured either by a manufacturing method of a deposition mask described below or another method.

Figure 2:
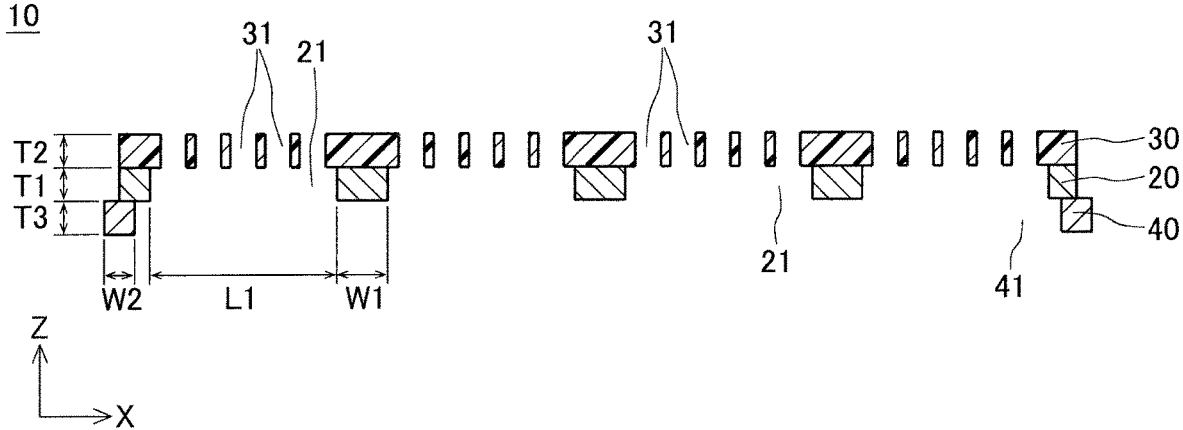
FIG. 2 is a sectional view of the deposition mask of FIG. 1, taken along a line II-II.

As shown in FIGS. 1 and 2, a deposition mask 10 according to this embodiment is a deposition mask for simultaneously forming deposition patterns corresponding to screens. The deposition mask 10 comprises a metal layer 20 provided with first openings 21, and a resin mask 30 laminated to the metal layer 20 and provided with second openings 31. The second openings 31 correspond to a pattern to be made by deposition. A support 40 is fixed to the metal layer 20.

The deposition mask 10 is used for simultaneously forming deposition patterns of screens. Deposition patterns for products can be formed at the same time by using one deposition mask 10. The "second openings" correspond to a pattern to be made by using the deposition mask 10. For example, when the deposition mask is used for forming an organic layer in an organic EL display, the shape of the second opening 31 is reflected in the shape of the organic layer. A "one screen" comprises an aggregate of the second openings 31 corresponding to one product. When the product is an organic EL display, the aggregate of the organic layers needed to form one organic EL display constitutes a "one screen". Namely, an aggregate of the second openings 31 corresponding to the organic layers constitutes a "one screen". Herein, an area corresponding to a screen is also referred to as "effective part". A plurality of screens such as the aforementioned "one screen" is arranged in the resin mask 30 at predetermined intervals. Namely, the resin mask 30 is provided with the second openings 31 needed to form screens. Thus, the deposition mask 10 can simultaneously form deposition patterns corresponding to screens.

The metal layer 20 is provided on a surface of the resin mask 30. In the example shown in FIG. 2, the metal layer 20 is provided on a surface of the resin mask 30 facing negative in a Z direction. The metal layer 20 has a rectangular shape. The rectangular shape has a pair of sides extending in an X direction and a pair of sides extending in a Y direction. First openings 21 extending in the X direction and/or the Y direction are formed in the metal layer 20. The first opening 21 may have an elongated slit shape. The first openings 21 are provided in an area overlapping the resin mask 30. The second openings 31 are arranged inside one of the first openings 21 in a plan view. The layout of the first openings 21 is not specifically limited. The first openings 21 may be longitudinally arranged in lines, or the first openings 21 may be transversely arranged in lines. Longitudinally extending first openings 21 may be arranged in transverse lines. Transversely extending first openings 21 may be arranged in longitudinal lines. The first openings 21 may be longitudinally arranged in one line or may be transversely arranged in one line.

Each first opening 21 has a rectangular shape. The sides of first opening 21 respectively extend in the X direction and the Y direction. Each first opening 21 is provided in an area overlapping at least one entire screen. A length L1 of the side of each first opening 21 may be, for example, greater than or equal to a length of a side of the effective part of the mask. The length L1 of the side of each first opening 21 may exceed the side length of the effective part by 40 mm or less. A spacing W2 between the adjacent first openings 21 may be, for example, 1 mm or more and 50 mm or less.

The material of the metal layer 20 is not specifically limited. A conventionally known material in the field of a deposition mask can be suitably selected and used as the material of the metal layer 20. For example, the material of the metal layer 20 includes metal materials such as stainless steel, iron nickel alloy, or aluminum alloy. As an iron nickel alloy for the metal layer 20, for example, an iron alloy having a total content of nickel and cobalt of 30% or more and 54% or less by mass, and a cobalt content of 0% or more and 6% or less by mass may be adopted. Specific examples of an iron alloy containing nickel or nickel and cobalt include an invar material having a nickel content of 34% or more and 38% or less by mass, a super invar material having a cobalt in addition to a nickel content of 30% or more and 34% or less by mass, etc. The material of the metal plate constituting the deposition mask 10 may be a Fe—Ni based plating alloy with a low thermal expansion, the alloy having a nickel content of 34% or more and 54% or less by mass.

A thickness T1 of the metal layer 20 is also not specifically limited. In order to effectively prevent occurrence of shadow, the thickness T1 of the metal layer 20 is preferably 100 μm or less, more preferably 50 μm or less, and particularly preferably 35 μm or less. When the thickness T1 of the metal layer 20 is 1 μm or more, risks such as breakage and/or deformation of the metal layer 20 can be reduced, and the metal layer 20 can be easily handled. The phenomenon in which a no-deposition portion having a thickness smaller than an intended deposition film thickness is generated is called shadow. The phenomenon occurs when a part of a deposition material released from a deposition source hits a portion of the metal layer 20 near a surface on the support 40 side, thus failing to reach the deposition target. In particular, as the shape of the second opening 31 is being refined, the influence of shadow increases.

The resin mask 30 is provided on a surface of the metal layer 20. In the example shown in FIG. 2, the resin mask 30 is provided on a surface of the metal layer 20 facing positive in the Z direction. The resin mask 30 has a rectangular shape. The sides of the resin mask extend in the X direction and the Y direction respectively. In this case, the resin mask 30 has the same outer shape of the metal layer 20. However, not being limited thereto, the resin mask 30 and the metal layer 20 may have different outer shapes.

The resin mask 30 is provided with the second openings 31 needed to form screens. The second openings 31 are provided in areas overlapping the first openings 21 when the metal layer 20 and the resin mask 30 are laminated. A shape of each second opening 31 is not specifically limited and, for example, is rectangular. A dimension L2 of the second opening 31 is, for example, 8 μm or more and 32 μm or less.

A conventionally known resin material may be suitably selected and used for the resin mask 30. A material of the resin mask 30 is not specifically limited and a material which enables the forming of high-definition second opening 31 by laser processing or the like is preferably used. A material having a low ratio of change in dimension with heating and/or aging and having a low moisture-absorption ratio is preferably used as the material of the resin mask 30. A light-weight material is preferably used as the material of the resin mask 30. Examples of such a material include polyimide, polyamide, polyamide-imide, polyester, polyethylene, polyvinyl alcohol, polypropylene, polycarbonate, polystyrene, polyacrylonitrile, ethylene vinyl acetate copolymer, ethylene vinyl alcohol copolymer, ethylene-methacrylic acid copolymer, polyvinyl chloride, polyvinylidene chloride, cellophane, and ionomer. Among the materials exemplified above, a resin material having a thermal expansion coefficient of 16 ppm/° C. or less is preferred. Among the materials exemplified above, a resin material having a moisture-absorption ratio of 1.0% or less is preferred. A material satisfying both conditions of the thermal expansion coefficient and the moisture-absorption ratio is particularly preferred. A resin mask formed of such a resin material can improve the dimensional accuracy of the second openings 31 and can have a low ratio of change in dimension with heating and/or aging and a low moisture-absorption ratio.

A thickness T2 of the resin mask 30 is also not specifically limited and is preferably 3 μm or more and 25 μm or less. The resin mask 30 having the thickness T2 within this range can reduce the risk of defects such as pinholes and deformation of the resin mask 30, and also can effectively suppress occurrence of shadow. In particular, when the thickness T2 of the resin mask 30 is 3 μm or more and 10 μm or less, more preferably 4 μm or more and 8 μm or less, the influence of shadow can be more effectively reduced upon formation of a high-definition pattern exceeding 400 ppi. The resin mask 30 and the metal layer 20 may be joined to each other directly, or may be joined to each other through an adhesive layer. When the resin mask 30 and the metal layer 20 are joined to each other through an adhesive layer, a total thickness of the resin mask 30 and the adhesive layer is preferably within the aforementioned preferred thickness range.

The support 40 is provided on a surface of the metal layer 20. In the example shown in FIG. 2, the support 40 is provided on a surface of the metal layer 20 facing negative in the Z direction. The support 40 supports the resin mask 30 and the metal layer 20. The support 40 is referred to also as frame.

In the first embodiment, the support 40 supports the resin mask 30 and the metal layer 20 in a state where they are pulled in their planar directions such that the resin mask 30 and the metal layer 20 will not bend. The support 40 is a frame member having a substantially rectangular shape. The support 40 has through-hole 41 for exposing the second opening 31 to the deposition source. Namely, the second opening 31 is positioned inside the through-holes 41 in a plan view. An outer circumference of the support 40 is larger than those of the resin mask 30 and the metal layer 20. A material of the support 40 is not specifically limited and a metal material having a high rigidity such as SUS, an invar material, a ceramic material or the like may be adopted. The support 40 made of metal is preferred because it can be easily welded to the metal layer 20 and is not susceptible to deformation.

A thickness T3 of the support 40 is also not specifically limited. The thickness T3 of the support 40 is preferably 10 mm or more and 50 mm or less in terms of rigidity. W2 is a width between an end surface of the outer circumferential of the through-hole 41 and an end surface of the outer circumferential of the support 40. As long as the metal layer 20 can be fixed to the support 40, the width W2 is not specifically limited. For example, the width W2 is about 10 mm or more and 250 mm or less.

Whether the support 40 is provided is optional. The support 40 may not be provided. In this embodiment, the deposition mask 10 may include the support 40. Namely, the deposition mask 10 may be a deposition mask with support. The deposition mask 10 may not include the support 40.

(Manufacturing Method of Deposition Mask)

A manufacturing method of a deposition mask according to this embodiment is described with reference to FIGS. 3 to 6. With reference to FIGS. 3a to 3e, a step of forming an intermediate is described first. The intermediate has a resin layer including a non-contact area.

Figure 3A:
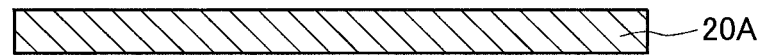
FIGS. 3a-3e are views showing a step of forming an intermediate having a resin layer including a non-contact area in a manufacturing method of a deposition mask according to the first embodiment.

A resin-layer forming step is described with reference to FIGS. 3a and 3b. In the resin-layer forming step, a resin layer 30A is formed on one surface of a substrate by applying a resin solution to the one surface of the substrate. First, as shown in FIG. 3a, a substrate is prepared. In this embodiment, a metal plate 20A is used as the substrate. The metal plate 20A is for making the aforementioned metal layer 20 of the deposition mask 10. The metal plate 20A may be a strip metal member having a width of, for example, 250 mm or more and 1000 mm or less. An invar material which is an iron nickel alloy is suitably usable as a material of the metal plate 20A. The metal plate 20A is suitably subjected to a washing process and a surface treatment.

Figure 3B:
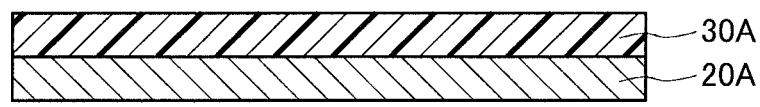

As shown in FIG. 3b, the resin layer 30A is formed on the one surface of the metal plate 20A. The resin layer 30A is for making the aforementioned resin mask 30 of the deposition mask 10. A resin solution such as a polyimide varnish is applied to substantially an entire surface of the metal plate 20A. Then, the resin solution is heated and dried. Thus, the resin layer 30A is obtained. A thickness of the resin solution applied to the one surface of the metal plate 20A is, for example, 3 μm or more and 250 μm or less.

Figure 3C:
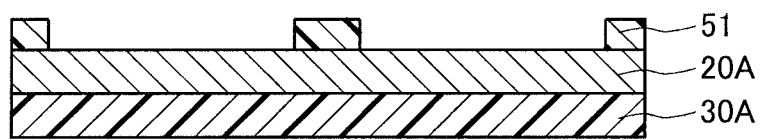

A step of forming the non-contact area in the resin layer 30A is described with reference to FIGS. 3c to 3e. The non-contact area is formed by removing at least a part of the substrate such as the metal plate 20A. The non-contact area is an area of the resin layer 30A which is not in contact with the one surface of the metal plate 20A. In the non-contact area, the resin layer 30A is released from restraint which the resin layer 30A receives from the metal plate 20A. In the description below, the step of forming the non-contact area in the resin layer 30A is also referred to as releasing step. In the releasing step, a masking member such as a resist material is first applied to the other surface of the metal plate 20A. The other surface of the metal plate 20A is a surface which is not provided with the resin layer 30A. Following thereto, predetermined portions of the resist material are exposed to light and developed. Thus, as shown in FIG. 3c, a resist pattern 51 is formed. The resist pattern 51 exposes an area of the metal plate 20A from the resist material. In the area the first opening 21 will be formed. The resist material for the masking member preferably has an improved processability and can achieve a desired resolution.

Figure 3D:
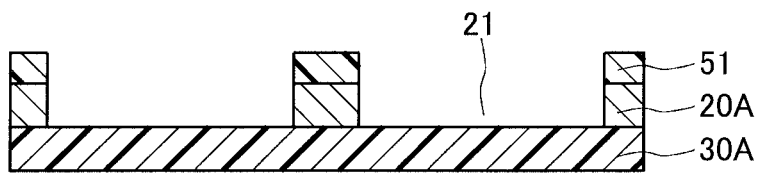

Then, as shown in FIG. 3d, the metal plate 20A is etched by using the resist pattern 51 as an etching-resistant mask. Thus, the metal layer 20 is obtained. The metal layer 20 is provided with first openings 21 extending longitudinally and/or transversely.

Figure 3E:
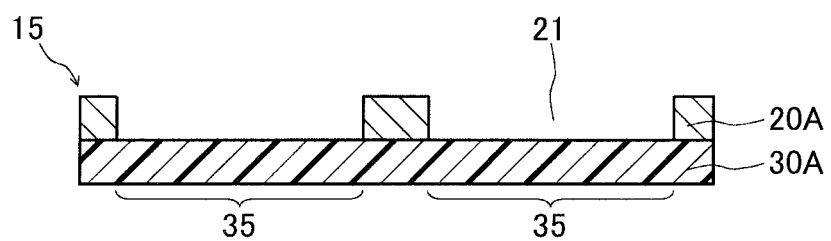

Then, as shown in FIG. 3e, the resist pattern 51 is washed and removed. After the resist pattern 51 has been removed, the resin layer 30A and the metal layer 20 may be cut into a size corresponding to the support 40.

In this manner, a laminate having the metal layer 20 provided with the first openings 21 and the resin layer 30A laminated to the metal layer 20 is obtained. In the laminate, the resin layer 30A partially includes a non-contact area 35 that is not in contact with the one surface of the metal plate 20A. In the description below, a member having the resin layer 30A including the non-contact area 35, like the laminate shown in FIG. 3e, is referred to also as intermediate 15.

In the above description, the example in which the resist material is used as the masking member is described. However, the above described patterning may be performed by laminating a dry film resist instead of applying the resist material. The metal layer 20 of the intermediate 15 is not limited to one which is formed by the above exemplified method, and a commercially available one is usable. The first openings 21 may be formed by a way of applying a laser beam instead of the way of etching.

When the resin layer 30A is formed by applying a resin solution and drying the resin solution, strain may occur and remain in the resin layer 30A. This embodiment proposes a relieving step for reducing the strain inside the resin layer 30A. The resin layer 30A including the non-contact area 35 is subjected to the relieving step before the second openings 31 are formed in the resin layer 30A.

Figure 4:
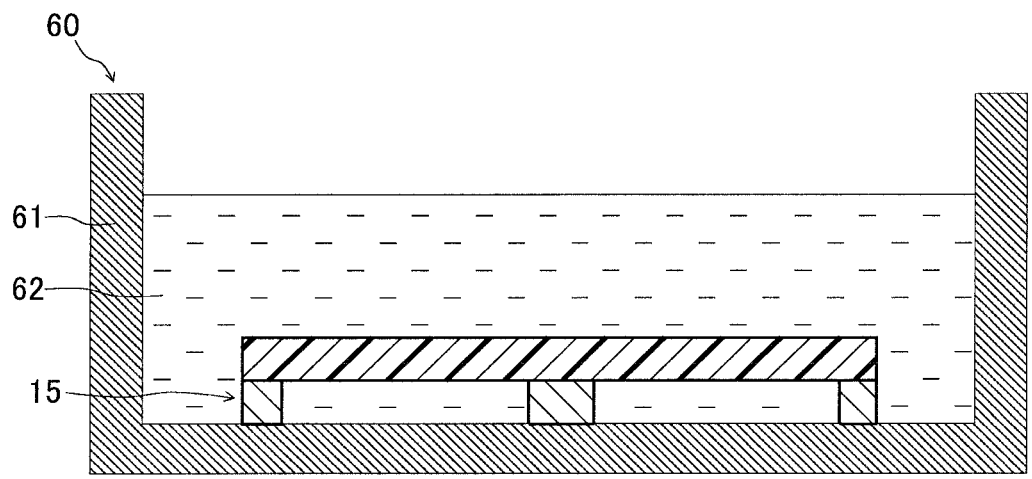
FIG. 4 is a view showing an example of a relieving step.

FIG. 4 shows an example of the relieving step. In the example shown in FIG. 4, the relieving step includes a liquid contacting step of bringing the resin layer 30A into contact with a liquid. In the liquid contacting step, a container 61 containing a liquid 62 such as a solvent is prepared first. Water, organic solvent, alkaline aqueous solution, etc., are usable as the liquid 62. NMP (N-methyl-2-pyrrolidone) or the like is usable as the organic solvent. Semi Clean RPG-1 manufactured by YOKOHAMA OILS & FATS INDUSTRY CO., LTD. is usable as the alkaline aqueous solution.

Following thereto, the intermediate 15 is immersed in the liquid 62. The intermediate 15 includes the metal layer 20 formed of the metal plate 20A having the first openings 21 formed therein and the resin layer 30A laminated to the metal layer 20. A time for immersing the intermediate 15 in the liquid 62 is preferably 10 minutes or more and 60 minutes or less, more preferably 15 minutes or more and 30 minutes or less. When the liquid is water, a temperature of the water is preferably 20° C. or more and 100° C. or less, more preferably 20° C. or more and 60° C. or less. The container 61 may be filled with the liquid 62 after the intermediate 15 has been placed in the container 61.

After the intermediate 15 has been taken out from the liquid 62, the intermediate 15 is dried. The intermediate 15 may be dried by natural drying or drying process using a dryer, an oven, etc. An organic solvent having a high boiling point such as NMP is usable as the liquid 62. In this case, after the intermediate 15 has been taken out from the liquid 62, the intermediate 15 may be again immersed in a low boiling-point solution having a boiling point lower than that of the liquid 62. After that, the intermediate 15 is taken out from the low boiling-point liquid and then dried. Alcohol such as isopropyl alcohol, or water is usable as the low boiling-point solution.

As supported by Examples described later, the strain inside the resin layer 30A can be reduced by bringing a liquid, such as water, into contact with the resin layer 30A having the residual strain.

The aforementioned liquid contacting step may include an ultrasonically processing step of ultrasonically processing the resin layer 30A. For example, the container 61 is provided with an ultrasonic vibrator that mechanically vibrates. Ultrasonic waves can be generated in the liquid 62 by vibrations of the ultrasonic vibrator. A frequency of the ultrasonic waves is 40 kHz or more and 170 kHz or less. Electric power applied to the ultrasonic vibrator is, for example, 100 W or more and 500 W or less.

Figure 5:
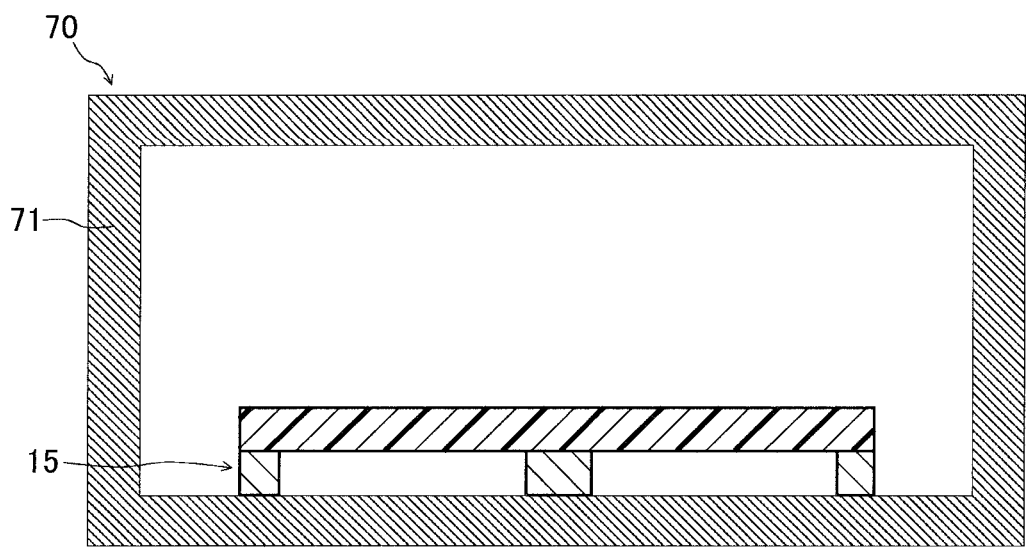
FIG. 5 is a view showing an example of the relieving step.

FIG. 5 shows another example of the relieving step. In the example shown in FIG. 5, the relieving step includes a heating step of heating the resin layer 30A. In the heating step, the intermediate 15 is heated by using an oven 71. A time for heating the intermediate 15 is preferably 10 minutes or more and 120 minutes or less, more preferably 30 minutes or more and 60 minutes or less. A heating temperature is preferably 80° C. or more and 150° C. or less, more preferably 100° C. or more and 120° C. or less.

As supported by Examples described later, the strain inside the resin layer 30A can be reduced by heating the resin layer 30A having the residual strain.

Both the aforementioned liquid contacting step and the heating step may be performed. For example, the heating step may be performed after the liquid contacting step. In this case, the heating step functions also as a drying step of removing a liquid adhering to the resin layer 30A of the intermediate 15. Alternatively, only one of the aforementioned liquid contacting step and the heating step may be performed.

Figure 6A:
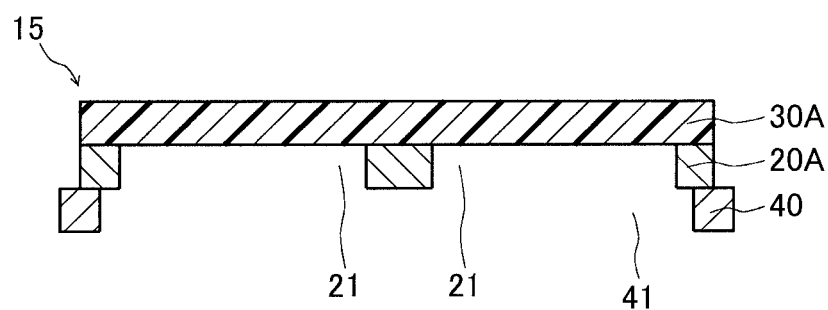
FIGS. 6a-6b are views showing a step of forming second openings in the resin layer.
Figure 6B:
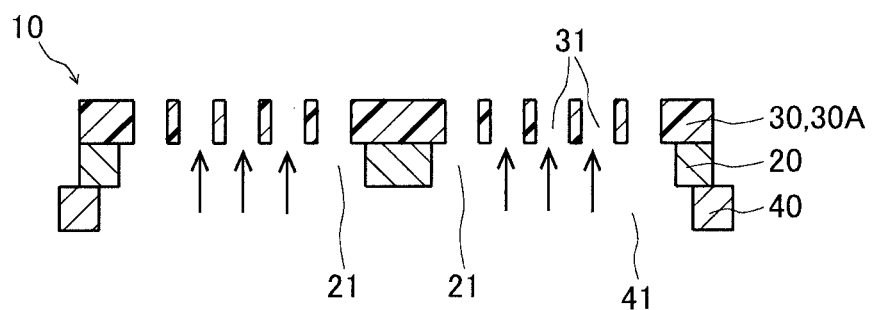

Then, a support fixing step is performed. In the support fixing step, as shown in FIG. 6a, the support 40 is prepared, and the metal layer 20 of the intermediate 15 is fixed to the support 40. The metal layer 20 of the intermediate 15 may be welded to the support 40 in a state where tension is applied to the metal layer 20. Although the support fixing step is an optional step in this embodiment, the deposition mask 10 to which the support 40 is fixed is often used in a conventional deposition apparatus. Thus, the support fixing step is preferably performed at this timing. A method of fixing the metal layer 20 to the support 40 is not specifically limited. For example, when the support 40 contains a metal, a conventionally known step or method such as spot welding may be suitably adopted.

A resin-layer processing step is performed. In the resin-layer processing step, the second openings 31 are formed in the resin layer 30A by processing the resin layer 30A. As shown by arrows in FIG. 6b, laser is applied to the resin layer 30A of the intermediate 15 from the metal layer 20 side. Thus, the second openings 31 corresponding to a pattern to be made by deposition are formed in the resin layer 30A. KrF excimer laser having a wavelength of 248 nm or YAG laser having wavelength of 355 nm is usable as laser. The second openings 31 may be formed by applying laser from the metal layer 20 side with the protective film being attached to a surface of the resin layer 30A opposite to the surface facing the metal layer 20. The second openings 31 may be formed by a laser processing method using a so-called reduced projection optical system. In this case, a not-shown laser mask corresponding to a pattern to be made by deposition is usable, and a condenser lens may be installed between the laser mask and the resin layer 30A. In this manner, the deposition mask 10 shown in FIGS. 1 and 2 is obtained.

Although not shown in figure, in the resin-layer processing step, laser may be applied to the resin layer 30A of the intermediate 15 not fixed to the support 40. In this case, the metal layer 20 may be fixed to the support 40 after the second opening 31 have been formed.

An inspecting step of inspecting a position of the second opening 31 may be performed. In the inspecting step, for example, a deposition mask 10 in which a difference between an ideal position of the second opening 31 and an actual position of the second opening 31 is within an allowable range is determined to be acceptable. The ideal position of the second opening 31 is predetermined as a relative position with respect to a reference point on the deposition mask 10, for example. The reference point is, for example, the central position of the deposition mask 10. The position of the second opening 31 is, for example, the central point of the second opening 31. The number of second openings 31 to be inspected is optional. For example, all the second openings 31 may be inspected or some of the second openings 31 may be inspected.

(Structure of Deposition Apparatus)

A deposition apparatus is described with reference to FIG. 7. The deposition apparatus deposits a deposition material to a deposition target by using the aforementioned deposition mask 10.

Figure 7:
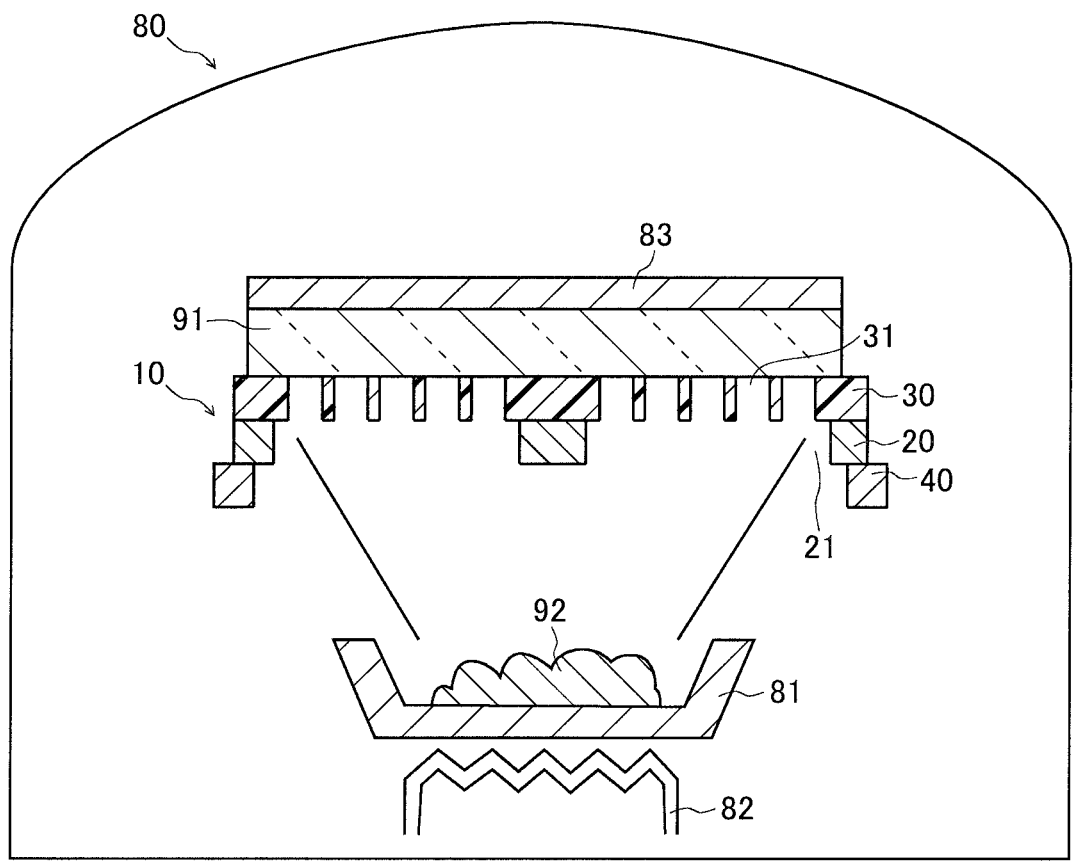
FIG. 7 is a schematic view showing a deposition apparatus.

As shown in FIG. 7, a deposition apparatus 80 has therein a deposition source (e.g., crucible 81), a heater 82 and the deposition mask 10. The deposition apparatus 80 further has evacuation means (not shown in figure) that creates a vacuum atmosphere inside the deposition apparatus 80. The crucible 81 accommodates a deposition material 92 such as an organic luminescence material. The heater 82 heats the crucible 81 and evaporates the deposition material 92 under a vacuum atmosphere. The deposition mask 10 is arranged to face the crucible 81. Namely, the deposition mask 10 is arranged in the deposition apparatus 80 such that the resin mask 30 faces a substrate to be deposited. The substrate to be deposited 91 is a deposition target to which the deposition material 92 is deposited. The substrate to be deposited 91 is, for example, an organic EL substrate. The deposition apparatus 80 may have a magnet 83. The magnet 83 is arranged on a surface of the substrate to be deposited 91 opposite to the surface facing the resin mask 30. Since the magnet 83 magnetically attracts the deposition mask 10 toward the magnet 83, the deposition mask 10 can be in contact with the substrate to be deposited 91.

Figure 8:
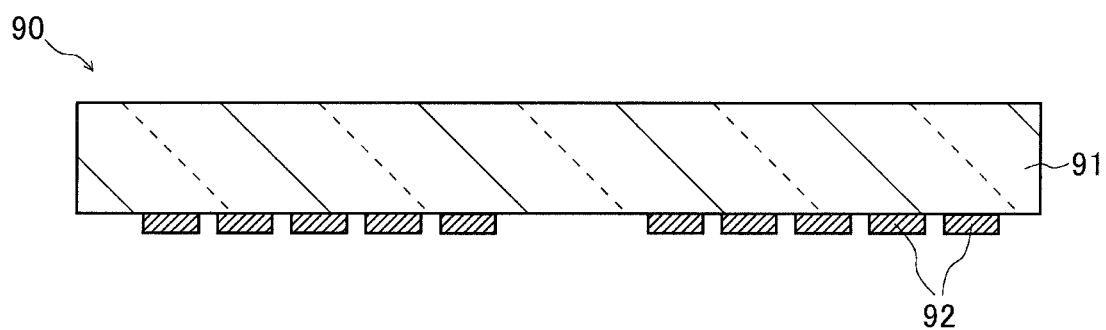
FIG. 8 is a schematic view showing an organic EL display made by using the deposition mask.

FIG. 8 is a sectional view showing an organic EL display 90 manufactured by using the deposition apparatus 80 shown in FIG. 7. As shown in FIG. 8, the organic EL display 90 comprises the substrate to be deposited 91 and pixels containing the deposition material 92 patterned on the substrate to be deposited 91. The substrate to be deposited 91 is, for example, the organic EL substrate.

In the case of displaying colors, the deposition apparatuses 80 provided with the deposition mask 10 corresponding to each color are respectively prepared. The substrate to be deposited 91 is put into the respective deposition apparatuses 80 in sequence. Thus, for example, an organic luminescence material for red color, an organic luminescence material for green color and an organic luminescence material for blue color can be deposited to the substrates to be deposited 91 in sequence.

(Manufacturing Method of Organic EL Display)

A manufacturing method of an organic EL display according to this embodiment is described with reference to FIGS. 9a to 9c. The manufacturing method of an organic EL display according to this embodiment forms a deposition pattern by depositing the deposition material 92 to the substrate to be deposited 91 by a deposition method using the aforementioned deposition mask 10.

Figure 9A:
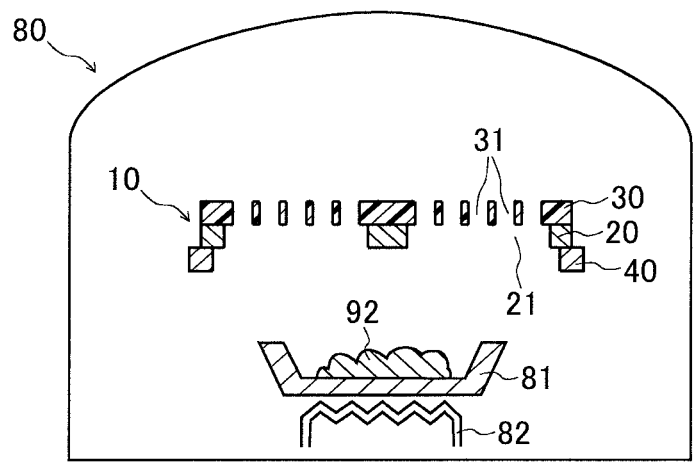
FIGS. 9a-9c are schematic views showing a manufacturing method of an organic EL display by using the deposition mask.

As shown in FIG. 9a, the deposition apparatus 80 comprising the deposition mask 10 shown in FIGS. 1 and 2, the crucible 81 accommodating the deposition material 92 and the heater 82 is prepared.

Figure 9B:
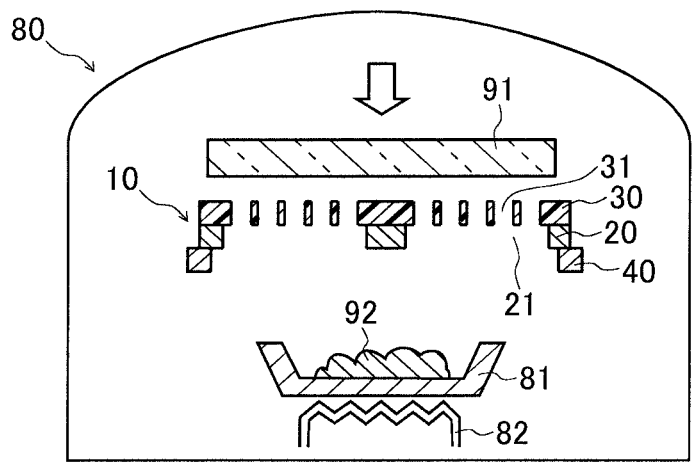
Figure 9C:
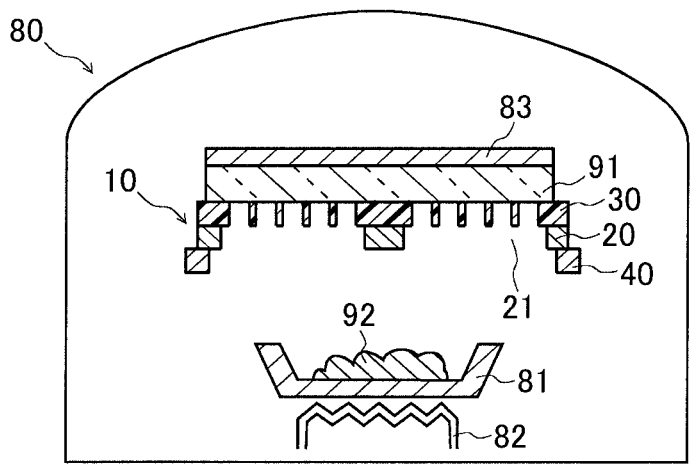

Next, as shown in FIG. 9b, the substrate to be deposited 91 and the deposition mask 10 are assembled such that the substrate to be deposited 91 and the resin mask 30 of the deposition mask 10 face each other. For example, the substrate to be deposited 91 is placed on the resin mask 30 of the deposition mask 10. At this time, for example, the substrate to be deposited 91 is placed on the deposition mask 10 by positioning the substrate to be deposited 91 such that a not-shown alignment mark of the substrate to be deposited 91 and a not-shown alignment mark of the deposition mask 10 align by direct observation.

Then, a deposition step is performed. In the deposition step, the deposition material 92 is deposited to the substrate to be deposited 91 placed on the resin mask 30 of the deposition mask 10. At this time, for example, as shown in FIG. 9c, the magnet 83 is arranged on a surface of the substrate to be deposited 91 opposite to the surface facing the deposition mask 10. Since the magnet 83 magnetically attracts the deposition mask 10 toward the magnet 83, the deposition mask 10 can be in contact with the substrate to be deposited 91. Then, the heater 82 heats the crucible 81 and evaporates the deposition material 92. The deposition material 92 evaporates from crucible 81 and reaches the deposition mask 10. The deposition material 92 is deposited to the substrate to be deposited 91 through the first opening 21 and the second opening 31.

In this manner, the deposition material 92 is deposited to the substrate to be deposited 91 in a desired pattern corresponding to the position of the second opening 31. Namely, the deposition material 92 is deposited to the substrate to be deposited 91 in a pattern having a shape corresponding to the second opening 31. Specifically, the deposition material 92 is deposited to the substrate to be deposited 91 in a pattern composed of polygons each having rounded corners. In this manner, the organic EL display 90 comprising the substrate to be deposited 91 and patterned pixels containing the deposition material 92 is obtained (see FIG. 8).

When the organic EL displays 90 are repeatedly made by using the deposition mask 10, organic substances and the like adhere to the deposition mask 10. The used deposition mask 10 is immersed in a washing liquid and washed in order to remove the organic substances. At this time, the deposition mask 10 may be washed by ultrasonic washing that generates ultrasonic waves in the washing liquid. A frequency of ultrasonic waves generated in the washing liquid is 40 kHz or more and 170 kHz or less, for example. When strain remains inside the resin layer 30A, the resin layer 30A may be displaced because of relief of the strain. As a result, the position of the second opening 31 may also be displaced.

In this embodiment, the strain inside the resin layer 30A is reduced by performing the relieving step to the resin layer 30A before the second opening 31 is formed in the resin layer 30A. Thus, when the resin layer 30A is brought into contact with a liquid or when the resin layer 30A is heated after the formation of the second opening 31, displacement of a position of the second opening 31 can be suppressed. Thus, a difference between an ideal position of the second opening 31 and an actual position of the second opening 31 can be suppressed from exceeding an allowable range after the deposition mask 10 has been determined to be acceptable in the inspecting step and shipped.

(Modification Example of Relieving Step and Support Fixing Step)

Figure 10:
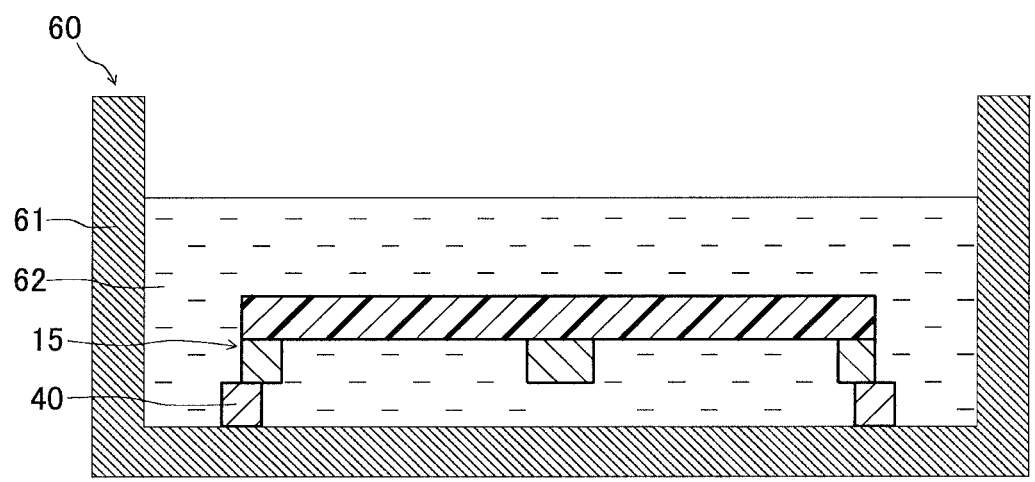
FIG. 10 is a view showing a modification example of the relieving step.
Figure 11:
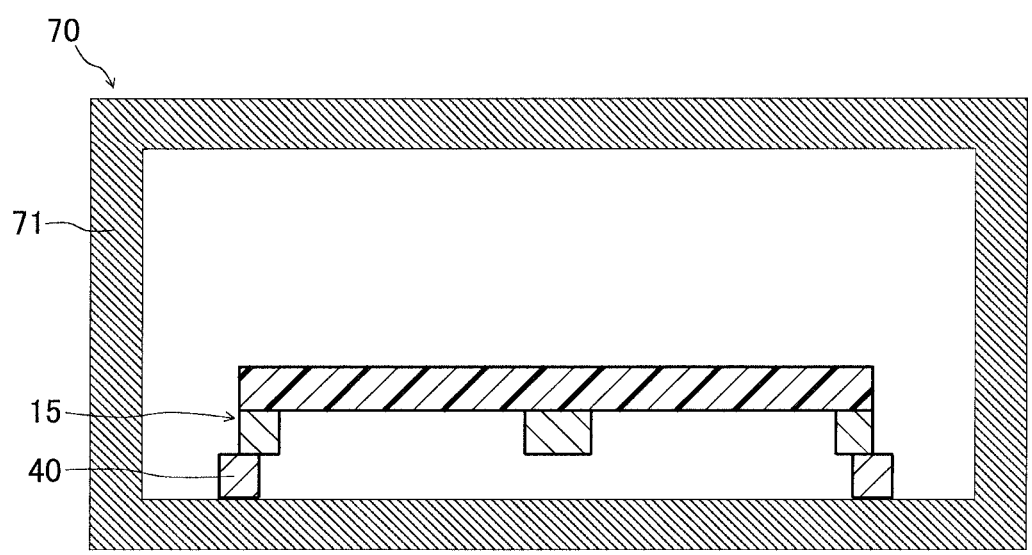
FIG. 11 is a view showing a modification example of the relieving step.

In the aforementioned embodiment, the example is shown in which the support fixing step of fixing the support 40 to the intermediate 15 is performed after the relieving step. However, not being limited thereto, the support fixing step may be performed before the relieving step. For example, as shown in FIG. 10, in the liquid contacting step of the relieving step, the liquid may be brought into contact with the intermediate 15 fixed to the support 40 in a state where tension is applied to the intermediate 15. In addition, as shown in FIG. 11, in the heating step of the relieving step, the intermediate 15 fixed to the support 40 in a state where tension is applied to the intermediate 15 may be heated.

Second Embodiment

Figure 12:
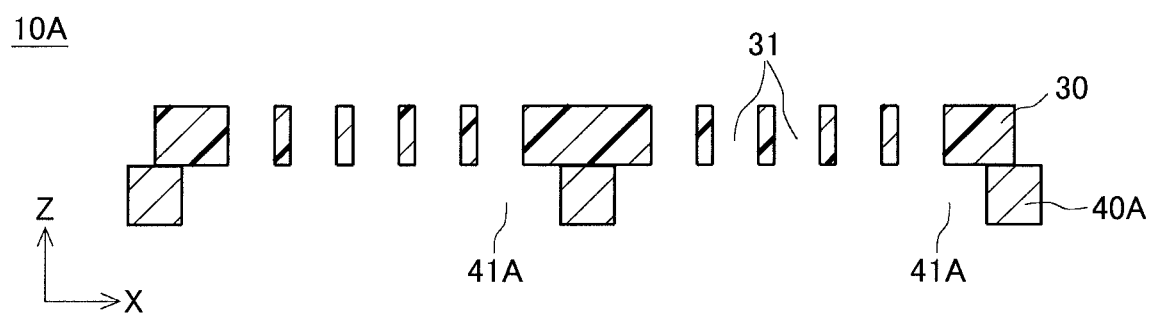
FIG. 12 is a sectional view of a deposition mask according to a second embodiment.

A second embodiment is described with reference to FIGS. 12 and 13. FIGS. 12 and 13 are views showing the second embodiment. The second embodiment differs from the aforementioned first embodiment in that the metal layer 20 is not provided, etc. In FIGS. 12 and 13, the same part of the first embodiment shown in FIGS. 1 to 11 designated by the same reference numeral, and detailed description thereof is omitted. Hereafter, differences from the first embodiment are mainly described.

FIG. 12 is a sectional view showing a deposition mask 10A according to the second embodiment. The deposition mask 10A comprises a resin mask 30 provided with second openings 31 and a support 40A fixed to the resin mask 30. The support 40A is a member also referred to as open mask.

The support 40A is provided on one surface of the resin mask 30. Through-holes 41A are formed in the support 40A. Each through-hole 41A is formed to have a size corresponding to one screen. The first openings 21B are arranged to overlap with the through-hole 41A in a plan view.

The support 40A supports the resin mask 30. The support 40A is joined to the resin mask 30 in a state either no tension is applied to the resin mask 30 or tension is applied to the resin mask 30. The support 40A is a sheet member having a thickness of 20 μm or more and 10 mm or less. The support 40A may be formed of a metal material such as invar or invar alloy. Although not shown in figure, the same support 40 as that of the first embodiment may further be provided to a surface of the support 40A. When the same support 40 as that of the first embodiment is provided to the surface of the support 40A, a thickness of the support 40A is preferably 20 μm or more and 1 mm or less. When the same support 40 as that of the first embodiment is not provided to the surface of the support 40A, the thickness of the support 40A is preferably 1 mm or more and 10 mm or less. For example, the support 40A made by shaving a thick metal plate having a thickness of 1 mm or more is usable. For example, a support 40A having areas with different thicknesses in its plane may be made by partially shaving a metal plate of about 10 mm thickness.

(Manufacturing Method of Deposition Mask)

A manufacturing method of a deposition mask according to this embodiment is described with reference to FIGS. 13a to 13d. FIGS. 13a to 13d are views showing a step of forming an intermediate having a resin layer including a non-contact area.

Figure 13A:
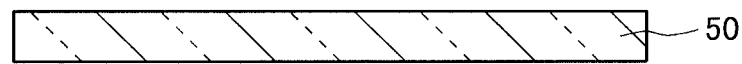
FIGS. 13a-13d are views showing a step of forming an intermediate having a resin layer including a non-contact area in a manufacturing method of a deposition mask according to the second embodiment.

As shown in FIG. 13a, a substrate is prepared. In this embodiment, a glass plate 50 is used as the substrate. A thickness of the glass plate 50 is, for example, 0.1 mm or more and 2.8 mm or less.

Figure 13B:

Next, as shown in FIG. 13b, a resin layer 30A is formed on the glass plate 50. The resin layer 30A is for making the aforementioned resin mask 30 of the deposition mask 10A. Specifically, the resin layer 30A is obtained by applying a resin solution such as a polyimide varnish to substantially an entire surface of the glass plate 50, and then heating and drying the resin solution. A thickness of the resin solution applied to the surface of the glass plate 50 is, for example, 3 μm or more and 250 μm or less.

Figure 13C:
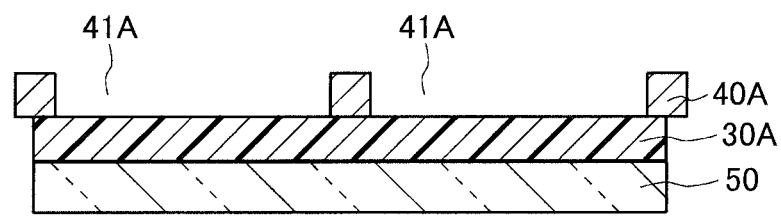
Figure 13D:
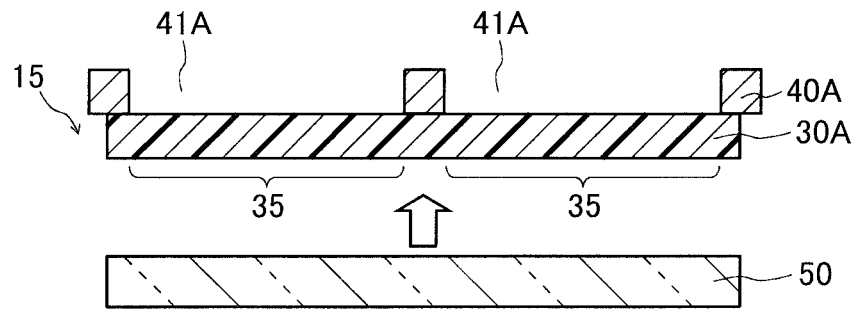

Next, as shown in FIG. 13c, a support fixing step of fixing a support 40A to the resin layer 30A is performed. Thereafter, as shown in FIG. 13d, a peeling step of peeling the resin layer 30A from the glass plate 50 is performed in a state where the resin layer 30A is fixed to the support 40A. Thus, as shown in FIG. 13c, a non-contact area 35 can be generated in the resin layer 30A. In the non-contact area 35, the resin layer 30A is not in contact with the surface of the glass plate 50. In this manner, an intermediate 15 having the resin layer 30A including the non-contact area 35 can be obtained. In this embodiment, the peeling step of peeling the resin layer 30A from the glass plate 50 serves as a releasing step of forming the non-contact area 35 in the resin layer 30A by removing the substrate.

Following thereto, a relieving step is performed. The reliving step brings the resin layer 30A of the intermediate 15 into contact with a liquid, or heats the resin layer 30A of the intermediate 15. Thereafter, a resin-layer processing step is performed. In the resin-layer processing step, second openings 31 are formed in the resin layer 30A by processing the resin layer 30A. Thus, a resin mask 30 provided with the second openings 31 is obtained. Since the relieving step and the resin-layer processing step are the same as those of the aforementioned first embodiment, description thereof is omitted.

Also, in this embodiment, the strain inside the resin layer 30A is reduced by performing the relieving step to the resin layer 30A before the second openings 31 are formed in the resin layer 30A. Thus, after the second openings 31 have been formed in the resin layer 30A, displacement of the positions of the second openings 31 can be suppressed.

Although not shown in figure, also in this embodiment, the support fixing step of fixing the support 40 to the intermediate 15 may be performed after the relieving step as is the case in the aforementioned embodiment.

Third Embodiment

Figure 14:
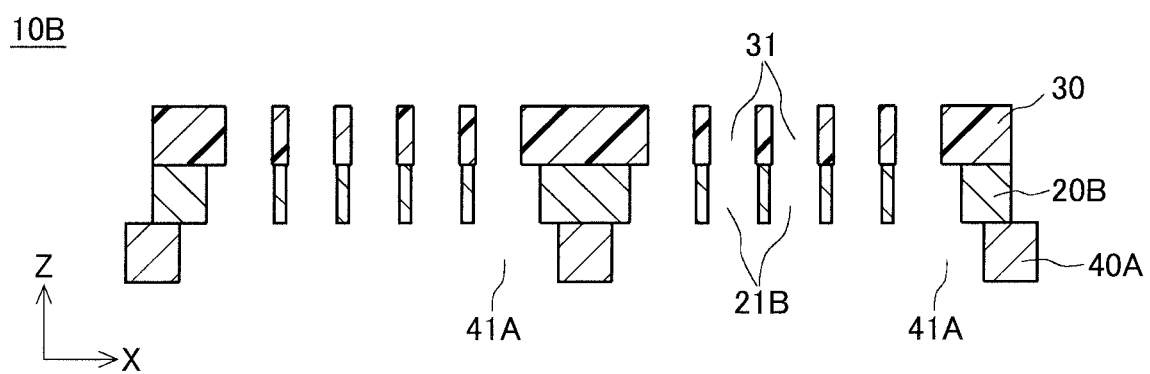
FIG. 14 is a sectional view of a deposition mask according to a third embodiment.

A third embodiment is described with reference to FIGS. 14 to 16. FIGS. 14 to 16 are views showing the third embodiment. The third embodiment differs from the aforementioned first embodiment in that the metal layer 20 is formed by a plating process, etc. In FIGS. 14 to 16, the same part of the first embodiment shown in FIGS. 1 to 11 or the second embodiment shown in FIGS. 12 and 13 is designated by the same reference numeral, and detailed description thereof is omitted. Hereafter, differences from the first embodiment or the second embodiment are mainly described.

(Structure of Deposition Mask)

A structure of a deposition mask according to this embodiment is described with reference to FIG. 14.

As shown in FIG. 14, a deposition mask 10B according to this embodiment comprises a metal layer 20B provided with first openings 21B and a resin mask 30 provided with second openings 31. A support 40A is fixed to the metal layer 20B.

The metal layer 20B is provided on a surface of the resin mask 30. In the example shown in FIG. 14, the metal layer 20B is provided on a surface of the resin layer 30 facing negative in a Z direction. First openings 21B extending longitudinally or transversely are formed in the metal layer 20B. In this embodiment, the metal layer 20B is formed by electrolytic plating. A material of such a metal layer 20B is not specifically limited. For example, the material of the metal layer 20B may be a metal material such as nickel or nickel alloy. A thickness of the metal layer 20B is not also specifically limited. A thickness of the metal layer 20B may be 1 μm or more and 50 μm or less.

The resin mask 30 is provided on a surface of the metal layer 20B. In the example shown in FIG. 14, the resin mask 30 is provided on a surface of the metal layer 20B facing positive in the Z direction. The resin mask 30 is provided with the second openings 31 needed to form screens. In this case, the second openings 31 are provided such that one second opening 31 overlaps with one first opening 21B in a plan view. However, not being limited thereto, the second openings 31 may be provided such that the second openings 31 overlap with one first opening 21B in a plan view.

The support 40A is provided on a surface of the metal layer 20B. In the example shown in FIG. 14, the support 40 is provided on the surface of the metal layer 20B facing negative in the Z direction. Through-holes 41A are formed in the support 40A. Each through-hole 41A is formed to have a size corresponding to one screen. The through-hole 41A is arranged to overlap with the first openings 21B and the second openings 31 in a plan view.

The support 40A supports the metal layer 20B. The support 40A is joined to the metal layer 20B in a state either no tension is applied to the metal layer 20B or tension is applied to the metal layer 20B. The support 40A is a sheet member having a thickness of 20 μm or more and 10 mm or less. The support 40A may be formed of a metal material such as invar or invar alloy. Although not shown in figure, the same support 40 as that of the first embodiment may further be provided on a surface of the support 40A. When the same support 40 as that of the first embodiment is provided on a surface of the support 40A, a thickness of the support 40A is preferably 20 μm or more and 1 mm or less. When the same support 40 as that of the first embodiment is not provided on a surface of the support 40A, the thickness of the support 40A is preferably 1 mm or more and 10 mm or less. For example, the support 40A made by shaving a thick metal plate having a thickness of 1 mm or more is usable. For example, a support 40A having areas with different thicknesses in a plane may be made by partially shaving a metal plate of about 10 mm thickness.

(Manufacturing Method of Deposition Mask)

A manufacturing method of a deposition mask according to this embodiment is described with reference to FIGS. 15 and 16. A step of forming an intermediate having a resin layer including non-contact area is described with reference to FIGS. 15a to 15f.

Figure 15A:
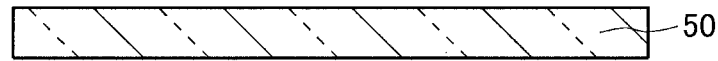
FIGS. 15a-15f are views showing a step of forming an intermediate having a resin layer including a non-contact area in a manufacturing method of a deposition mask according to the third embodiment.
Figure 15B:
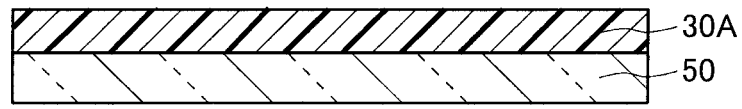

A resin-layer forming step is described with reference to FIGS. 15a and 15b. In the resin-layer forming step, a resin solution is applied to a surface of a substrate so that a resin layer 30A is formed on the surface of the substrate. First, a substrate is prepared as shown in FIG. 15a. As is the case in the second embodiment, this embodiment uses a glass plate 50 as the substrate. Then, as is the case in the second embodiment, as shown in FIG. 15b, a resin layer 30A is formed on the glass plate 50. A thickness of the resin solution applied to the surface of the glass plate 50 is, for example, 3 μm or more and 250 μm or less.

Figure 15C:
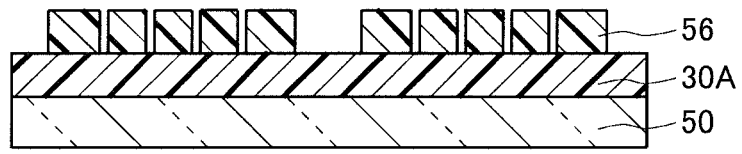

A releasing step is described with reference to FIGS. 15c to 15f. The releasing step generates a non-contact area at least partially in the resin layer 30A. In the non-contact area, the resin layer 30A is not in contact with the surface of the metal plate 20A. As shown in FIG. 15c, a not-shown seed layer made of a metal such as nickel is formed on the resin layer 30A. Next, a photosensitive resist is applied to the seed layer, and the photosensitive resist is dried. Following thereto, the photosensitive resist is exposed to light through a photomask, and developed. Thus, a resist layer 56 having a pattern corresponding to the first openings 21B is formed.

Figure 15D:
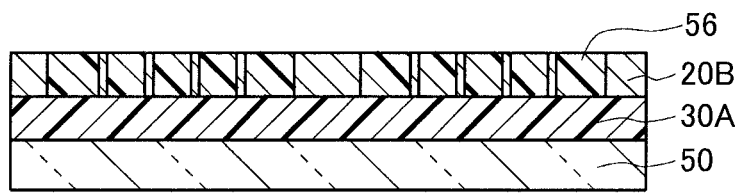

Next, as shown in FIG. 15d, the glass plate 50 and the resin layer 30A are electrolytically plated. Thus, a metal such as nickel is precipitated on the seed layer formed on the resin layer 30A. The metal precipitates on a portion on the seed layer where the resist layer 56 does not exist. Thus, the metal layer 20B is formed.

Figure 15E:
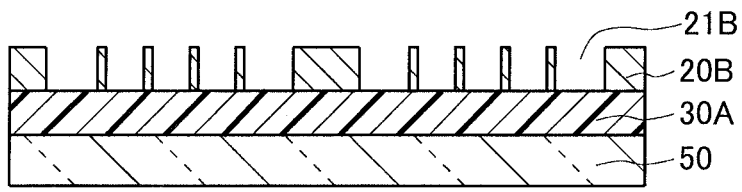

Following thereto, as shown in FIG. 15e, the resist layer 56 and the seed layer are removed in sequence, and the metal layer 20B provided with the second openings 21B is formed on the resin layer 30A.

Figure 15F:
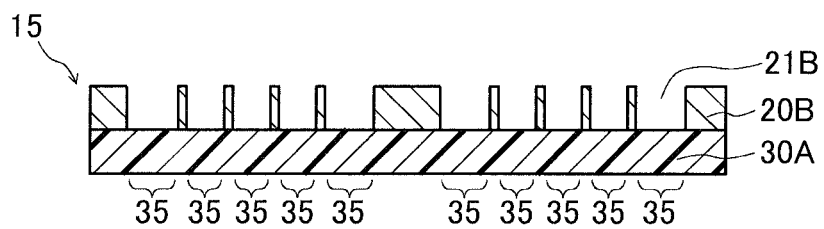

Thereafter, as shown in FIG. 15f, a peeling step is performed. In the peeling step, the resin layer 30A laminated to the metal layer 20B is peeled from the glass plate 50. Thus, as shown in FIG. 15f, a non-contact area 35 can be formed in the resin layer 30A. In the non-contact area 35, the resin layer 30A is not in contact with a surface of the glass plate 50. In this manner, an intermediate 15 having the resin layer 30A including the non-contact area 35 and the metal layer 20B laminated to the resin layer 30A can be obtained. Also in this embodiment, as is the case in the second embodiment, the peeling step of peeling the resin layer 30A from the glass plate 50 serves as a releasing step of forming the non-contact area 35 in the resin layer 30A by removing the substrate.

Following thereto, a relieving step is performed. The reliving step brings the resin layer 30A of the intermediate 15 into contact with a liquid, or heats the resin layer 30A of the intermediate 15. Since the relieving step is the same as that of the aforementioned first embodiment, description thereof is omitted.

Figure 16A:
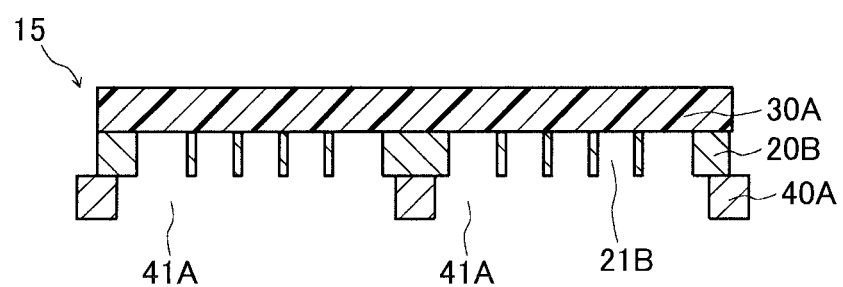
FIGS. 16a-16b are views showing a step of forming second opening in a resin layer.
Figure 16B:
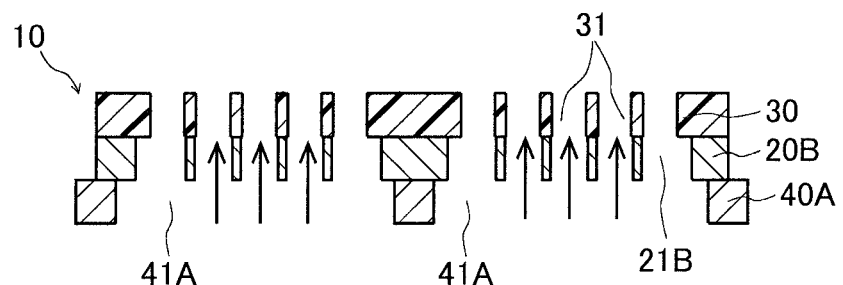

Following thereto, as shown in FIG. 16a, a support fixing step is performed. In the support fixing step, a support 40 is prepared and then the metal layer 20 of the intermediate 15 is fixed to the support 40. Thereafter, a resin-layer processing step is performed. In the resin-layer processing step, the second openings 31 are formed in the resin layer 30A by processing the resin layer 30A. As shown by arrows in FIG. 16b, laser is applied to the resin layer 30A of the intermediate 15 from the metal layer 208 side so that the second openings 31 are formed. In this manner, the resin mask 30 provided with the second openings 31 is obtained.

Also, in this embodiment, the strain inside the resin layer 30A is reduced by performing the relieving step to the resin layer 30A before the second openings 31 are formed in the resin layer 30A. Thus, after the second openings 31 in the resin layer 30A has been formed, displacement of the positions of the second openings 31 can be suppressed.

Although not shown in figure, the support fixing step of fixing the metal layer 20 to the support 40 may be performed after the resin-layer processing step of forming the second opening 31 in the resin layer 30A has been performed.

Modification Example 1 of Manufacturing Method of Deposition Mask

A modification example of the manufacturing method of a deposition mask according to this embodiment is described with reference to FIGS. 17a to 17f.

As shown in FIGS. 17a to 17e, a resin layer 30A is formed on a surface of a glass plate 50, and then a metal layer 20B provided with first openings 21B is formed on a surface of the resin layer 30A. Since these steps are the same as the aforementioned steps shown in FIGS. 15a to 15e, detailed description thereof is omitted.

Figure 17A:
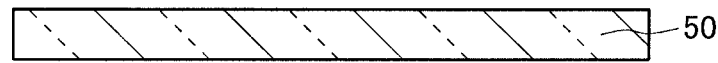
FIGS. 17a-17g are views showing a step of forming an intermediate having a resin layer including a non-contact area in a manufacturing method of a deposition mask according to a modification example of the third embodiment.
Figure 17B:
Figure 17C:
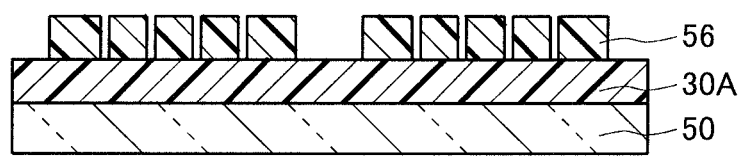
Figure 17D:
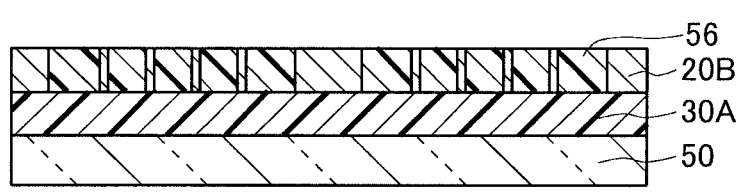
Figure 17E:
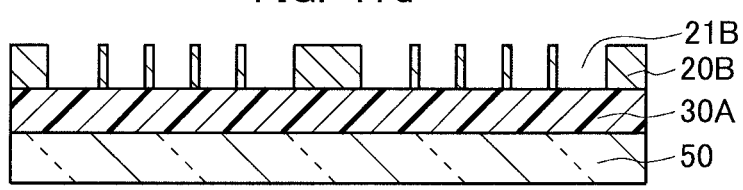
Figure 17F:
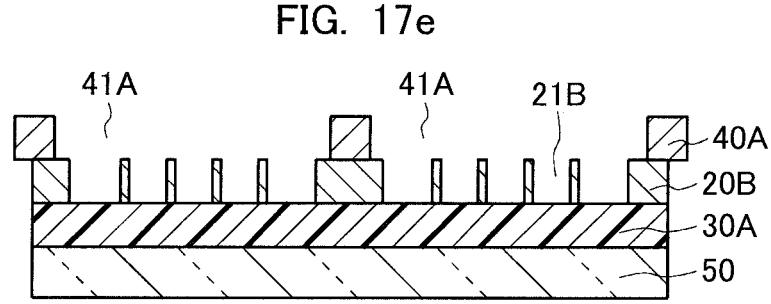

Next, as shown in FIG. 17f, the metal layer 20B of a laminate is fixed to a support 40A. The laminate includes the resin layer 30A and the metal layer 20B. The metal layer 20B of the laminate is welded to the support 40A in a state where no tension is applied to the laminate.

Figure 17G:
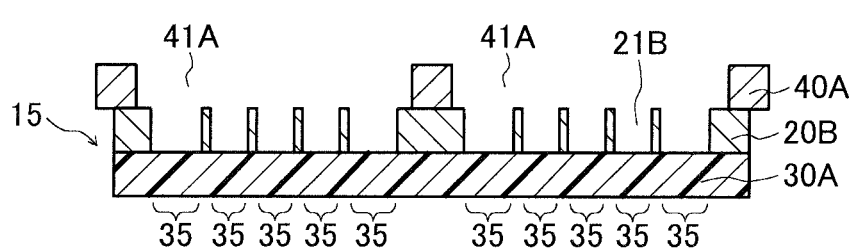

Next, as shown in FIG. 17g, a peeling step is performed. In the peeling step, the resin layer 30A is peeled from the glass plate 50 in a state where the resin layer 30A, the metal layer 20B and the support 40A are laminated. Thus, as shown in FIG. 17g, a non-contact area 35 can be generated in the resin layer 30A. In the non-contact area 35, the resin layer 30A is not in contact with a surface of the glass plate 50. In this manner, an intermediate 15 having the resin layer 30A including the non-contact area 35 and the metal layer 20B laminated to the resin layer 30A is obtained wherein the support 40A has been fixed to the intermediate 15.

Following thereto, a relieving step is performed. The reliving step brings the resin layer 30A of the intermediate 15 into contact with a liquid, or heats the resin layer 30A of the intermediate 15. As is the case in the aforementioned relieving step shown in FIG. 10 or 11, the relieving step is performed to the intermediate 15 in a state where the support is fixed to the intermediate 15.

Thereafter, a resin-layer processing step is performed. In the resin-layer processing step, second openings 31 are formed in the resin layer 30A by processing the resin layer 30A. In this manner, a resin mask 30 provided with the second openings 31 is obtained.

Elements disclosed in the aforementioned embodiments and the modification examples may be suitably combined according to need. Alternatively, some elements may be deleted from the elements disclosed in the aforementioned embodiments and the modification examples.

EXAMPLES

Next, the present invention is described in more detail with examples. The present invention is, however, not limited to the following examples as long as it does not go out from the scope of the present invention.

Example 1

A deposition mask 10 according to the aforementioned first embodiment was made by a procedure described below. First, a metal plate 20A having the thickness of 20 μm and containing an iron nickel alloy was prepared. The metal plate 20A was of a rectangular shape having long sides of 730 mm and short sides of 460 mm. The content ratio of nickel in the metal plate 20A was 36% by mass. Then, a resin layer 30A having the thickness of 5 μm and containing polyimide was formed on the metal plate 20A. Following thereto, first openings 21 were formed in the metal plate 20A by etching the metal plate 20A. In this manner, an intermediate 15 having the resin layer 30A including a non-contact area 35 was obtained. Following thereto, a support 40 was fixed to the metal layer 20 of the intermediate 15 in a state where tension was applied to the intermediate 15.

Following thereto, the intermediate 15 fixed to the support 40 was ultrasonically processed by using pure water for 15 minutes. The frequency was 80 kHz and the temperature of the pure water was 25° C. Thereafter, the intermediate 15 was heated at 100° C. for 30 minutes by using an oven.

Thereafter, second openings 31 were formed in the resin layer 30A by applying a laser beam to the resin layer 30A. The dimension of the second opening 31 was 16 μm. In this manner, the deposition mask 10 was made.

Figure 18:
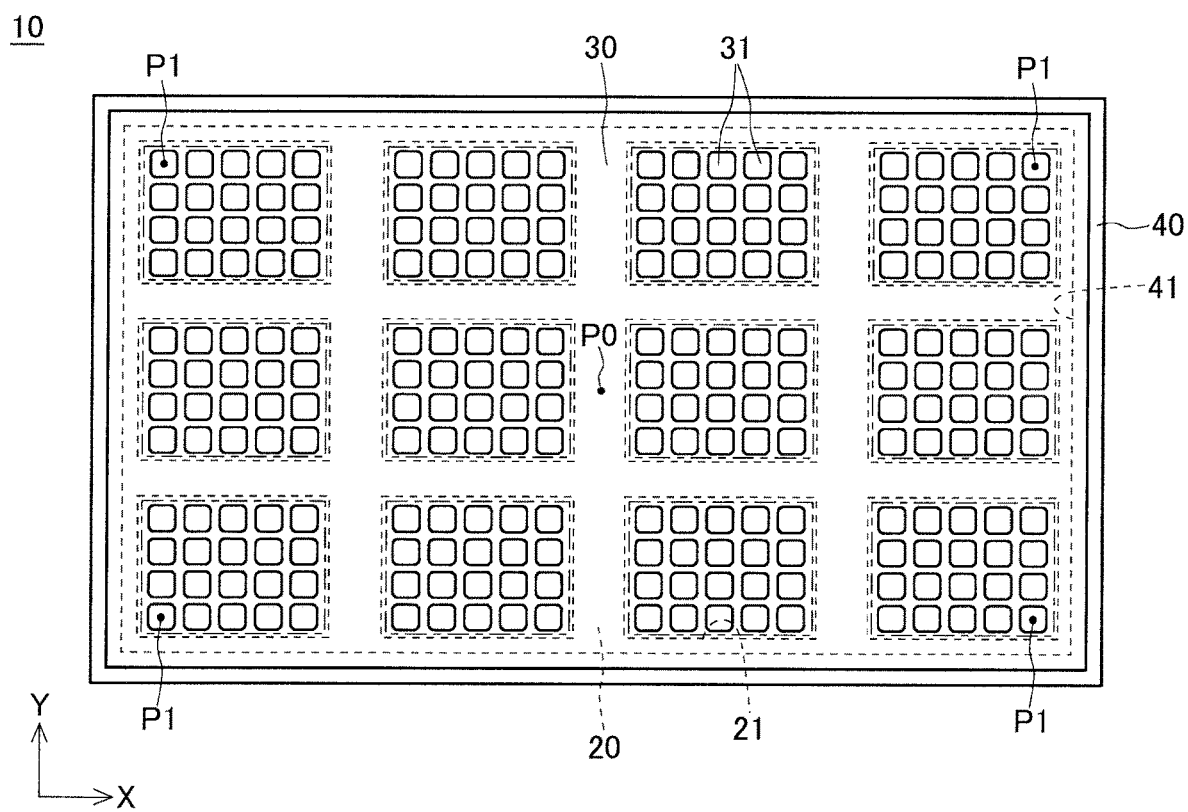
FIG. 18 is a view showing a method of measuring positions of the second openings in Examples.

Thereafter, positions of the second openings 31 were measured. Specifically, as shown in FIG. 18, positions of the center point P1 of the second openings 31 in the deposition mask 10 with respect to the reference point P0 were measured. The reference point P0 was the center position of the deposition mask 10. The number of second opening 31 to be measured was 36. An automatic 2D/3D coordinate measuring machine AMIC-700 manufactured by Shinto S Precision was used as a measuring instrument.

Following thereto, the deposition mask 10 was washed. Specifically, the deposition mask 10 was ultrasonically washed by using pure water for 15 minutes. Thereafter, the deposition mask 10 was heated at 100° C. for 30 minutes by using an oven and dried. The frequency was 80 kHz and the temperature of the pure water was 25° C. The temperature of the oven was 100° C. and the heating time was 30 minutes.

After the first washing, the positions of the second openings 31 were again measured. In addition, the amount of change in the position of each second opening 31 before and after the first washing was calculated. FIG. 19 shows the average value, the maximum value and the minimum value of amounts of change in the positions of the 36 second openings 31.

Following thereto, the deposition mask 10 was again washed. The washing conditions were the same as those of the first washing.

After the second washing, the positions of the second opening 31 were again measured. In addition, the amount of change in the position of each second opening 31 before and after the second washing was calculated. FIG. 19 shows the average value, the maximum value and the minimum value of amounts of change in the positions of the 36 second opening 31.

Comparative Example 1

A deposition mask 10 was made in the same manner as in Example 1 except that the resin layer 30A was not ultrasonically processed nor heated before the second openings 31 were formed. As is the case in Example 1, positions of the second openings 31 were measured.

Following thereto, as is the case in Example 1, the deposition mask 10 was washed. After the first washing, as is the case in Example 1, the positions of the second openings 31 were again measured. In addition, the amount of change in the position of each second opening 31 before and after the first washing was calculated. FIG. 19 shows the average value, the maximum value and the minimum value of amounts of change in the positions of the 36 second openings 31.

As shown in FIG. 19, in Example 1, the average value of amounts of change in the positions of the second openings 31 before and after the first washing was 1 μm or less both in the X direction and the Y direction. To be specific, the average value of amount of change was 0.6 μm or less. On the other hand, in Comparative Example 1, the average value of amounts of change in the positions of the second openings 31 before and after the first washing was over 1 μm both in the X direction and the Y direction. Accordingly, it can be said that ultrasonically processing and heating of the resin layer 30A before forming the second opening 31 in the resin layer 30A contribute to suppress change in a position of the second opening 31 caused by washing.

As shown in FIG. 19, in Example 1, the average value and the maximum value of amounts of change in the positions of the second openings 31 before and after the first washing were about the same as the average value and the maximum value of amounts of change in the positions of the second openings 31 before and after the second washing. From these results, the deposition mask 10 in Example 1 is expected to have stability in position of the second opening 31 even after it is repeatedly washed.

Example 2

As is the case in Example 1, an intermediate 15 having a resin layer 30A including a non-contact area 35 was made. Following thereto, a support 40 was fixed to the metal layer 20 of the intermediate 15 in a state where tension was applied to the intermediate 15.

Following thereto, the intermediate 15 fixed to the support 40 was immersed in pure water for 15 minutes. The temperature of the pure water was 25° C. Thereafter, the intermediate 15 was heated at 100° C. for 30 minutes by using an oven.

Thereafter, second openings 31 were formed in the resin layer 30A by applying a laser beam to the resin layer 30A. The dimension of the second opening 31 was 16 μm. In this manner, the deposition mask 10 was made.

Thereafter, as is the case in the Example 1, positions of the second openings 31 were measured. Then, the deposition mask 10 was washed. Specifically, the deposition mask 10 was immersed in pure water for 15 minutes. Then, the deposition mask 10 was dried by heating the deposition mask 10 at 100° C. for 30 minutes by using an oven. The temperature of the pure water was 25° C. The temperature of the oven was 100° C. and the heating time was 30 minutes.

After the first washing, the positions of the second openings 31 were again measured. In addition, the amount of change in the position of each second opening 31 before and after the first washing was calculated. FIG. 20 shows the average value, the maximum value and the minimum value of amounts of change in the positions of the 36 second openings 31.

Comparative Example 2

A deposition mask 10 was made in the same manner as in Example 2 except that the resin layer 30A was not immersed in pure water nor heated. As is the case in Example 2, positions of the second openings 31 were measured.

Following thereto, as is the case in Example 2, the deposition mask 10 was washed. After the first washing, as is the case in Example 2, the positions of the second openings 31 were again measured. In addition, the amount of change in the position of each second opening 31 before and after the first washing was calculated. FIG. 20 shows the average value, the maximum value and the minimum value of amounts of change in the positions of the 36 second opening 31.

As shown in FIG. 20, in Example 2, the average value of amounts of change in the positions of the second openings 31 before and after the first washing was 1 μm or less both in the X direction and the Y direction. To be specific, the average value of amounts of change was 0.8 μm or less. On the other hand, in Comparative Example 2, the average value of amounts of change in the positions of the second openings 31 before and after the first washing was over 1 μm both in the X direction and the Y direction. Accordingly, it can be said that immersing of the resin layer 30A in pure water and heating of the resin layer 30A before the second openings 31 are formed in the resin layer 30A contribute to suppress change in a position of the second opening 31 caused by washing.

Some modification examples of the aforementioned embodiments are described above. It goes without saying that these modification examples can be suitably combined.

10 Deposition mask
15 Intermediate
20 Metal layer
20A First opening
30 Resin mask
30A Resin layer
31 Second opening
35 Non-contact area
40 Support
41 Through-hole
50 Glass plate
60 Washing apparatus
61 Container
62 Liquid
70 Heating apparatus
71 Oven

What is claimed is:

1. A manufacturing method of a deposition mask comprising:
    a resin-layer forming step of forming a resin layer on a surface of a substrate by applying a resin solution to the surface of the substrate;
    a step of forming a non-contact area, which is not in contact with the surface of the substrate in the resin layer, by removing at least a part of the substrate;
    a step of bringing the resin layer into contact with a liquid after the non-contact area has been formed in the resin layer; and
    a resin-layer processing step of forming an opening in the resin layer by processing the resin layer after the step of bringing the resin layer into contact with the liquid,
    wherein the step of bringing the resin layer into contact with the liquid includes a liquid contacting step in which the resin layer is immersed in the liquid and then the resin layer is removed from the liquid.

2. The manufacturing method of a deposition mask according to claim 1, wherein the liquid contacting step includes an ultrasonic processing step of ultrasonically processing the resin layer.

3. The manufacturing method of a deposition mask according to claim 1, wherein the step of bringing the resin layer into contact with the liquid further includes a drying step of removing the liquid adhering to the resin layer after the liquid contacting step.

4. The manufacturing method of a deposition mask according to claim 1, wherein a thickness of the resin layer is 3 µm or more and 10 µm or less.

5. The manufacturing method of a deposition mask according to claim 1, wherein the resin-layer forming step includes a step of preparing a metal plate as the substrate and a step of forming a resin layer on the surface of the metal plate,
wherein the step of forming the non-contact area includes a step of forming an opening in the metal plate by etching the metal plate, and
wherein the step of bringing the resin layer into contact with the liquid includes a step of bringing the resin layer of a laminate including the metal plate, the opening formed in the metal plate, and the resin layer laminated to the metal plate, into contact with the liquid.

6. The manufacturing method of a deposition mask according to claim 5, further comprising a support fixing step of fixing the laminate to a support in a state where tension is applied to the laminate,
wherein the step of bringing the resin layer into contact with the liquid is performed to the resin layer of the laminate fixed to the support.

7. The manufacturing method of a deposition mask according to claim 5, wherein a thickness of the metal plate is 5 µm or more and 100 µm or less.

8. A manufacturing method of a deposition mask comprising:
a resin-layer forming step of forming a resin layer on a surface of a substrate by applying a resin solution to the surface of the substrate;
a step of forming a non-contact area, which is not in contact with the surface of the substrate in the resin layer, by removing at least a part of the substrate;
a step of bringing the resin layer into contact with a liquid or heating the resin layer after the non-contact area has been formed in the resin layer; and
a resin-layer processing step of forming an opening in the resin layer by processing the resin layer after the step of bringing the resin layer into contact with the liquid or heating the resin layer,
wherein the step of forming the non-contact area includes a step of peeling the resin layer from the substrate, and
wherein the step of bringing the resin layer into contact with the liquid or heating the resin layer includes a step of bringing the resin layer peeled from the substrate into contact with the liquid or heating the resin layer peeled from the substrate.

9. The manufacturing method of a deposition mask according to claim 8, further comprising a support fixing step of fixing the resin layer to a support,
wherein the step of bringing the resin layer into contact with the liquid or heating the resin layer includes a step of bringing the resin layer fixed to the support into contact with the liquid or heating the resin layer fixed to the support.

10. The manufacturing method of a deposition mask according to claim 1, comprising a step of forming a laminate by partially forming a metal layer on the resin layer by a plating process after the resin-layer forming step,
wherein the step of forming a non-contact area includes a step of bringing the resin layer of the laminate into contact with the liquid or.

11. The manufacturing method of a deposition mask according to claim 10, further comprising a support fixing step of fixing the laminate to a support,
wherein the step of bringing the resin layer into contact with the liquid is performed to the resin layer of the laminate fixed to the support.

12. The manufacturing method of a deposition mask according to claim 10, wherein a thickness of the metal layer is 1 µm or more and 50 µm or less.

13. A manufacturing method of an organic EL display comprising:
a step of preparing a deposition mask manufactured by the manufacturing method of a deposition mask according to claim 1;
a step of assembling the deposition mask and an organic EL substrate such that the resin layer of the deposition mask faces the organic EL substrate; and
a deposition step of depositing a deposition material to the organic EL substrate through the second opening in the resin layer of the deposition mask.

14. The manufacturing method of an organic EL display according to claim 13, further comprising a step of washing the deposition mask after the deposition step.

15. The manufacturing method of an organic EL display according to claim 14, wherein the step of washing the deposition mask includes a step of immersing the deposition mask in a washing liquid.

16. The manufacturing method of an organic EL display according to claim 15, wherein the step of washing the deposition mask includes a step of generating ultrasonic waves in the washing liquid.

* * * * *